(12) United States Patent
Chang (10) Patent No.: US 6,961,266 B2
(45) Date of Patent: Nov. 1, 2005

(54) METHOD OF PROGRAMMING/READING MULTI-LEVEL FLASH MEMORY USING SENSING CIRCUIT

(75) Inventor: Seung Ho Chang, Cheongjoo-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/891,021

(22) Filed: Jul. 15, 2004

(65) Prior Publication Data

US 2005/0038953 A1 Feb. 17, 2005

Related U.S. Application Data

(62) Division of application No. 10/006,096, filed on Dec. 10, 2001, now Pat. No. 6,836,431.

(30) Foreign Application Priority Data

Jun. 29, 2001 (KR) .......................................... 2001-38430

(51) Int. Cl.$^7$ .............................................. G11C 16/04
(52) U.S. Cl. ............................ 365/185.03; 365/185.18; 365/185.2; 365/185.21; 365/185.24
(58) Field of Search ....................... 365/185.03, 185.18, 365/185.2, 185.21, 185.024

(56) References Cited

U.S. PATENT DOCUMENTS 5,684,739 A * 11/1997 Takeuchi ............... 365/185.03
5,943,260 A * 8/1999 Hirakawa ............... 365/185.03
6,172,912 B1 * 1/2001 Hirano et al. ........... 365/185.28
6,525,960 B2 * 2/2003 Yoshida et al. ......... 365/185.03

* cited by examiner

Primary Examiner—Connie C. Yoha
(74) Attorney, Agent, or Firm—Mayer, Brown, Rowe & Maw LLP

(57) ABSTRACT

A method of programming a multi-level flash memory using a sensing circuit according to the present invention performs an automatic verification program method of performing verification while performing a program. The method can reduce the power consumption by detecting a program data stored at a register to stop an operation of the sensing circuit for memory cells for which the program is completed. Also, a method of reading the flash memory senses the state of the threshold voltage of a cell using the sense amplifier used in the program operation while increasing or lowering the voltage applied to a control gate step-by-step and then stores the level value generated in a counter at the registers depending on its state, wherein an operation of the sensing circuit for the memory cells for which the program is completed is stopped. Therefore, the present invention can reduce the power consumption and allow a multi-level read to be implemented on an actual array with a simple sense amplifier structure step-by-step. In addition, the present invention can reduce the power consumption while simplifying the circuit construction by allowing a program/read operation to be simultaneously implemented on a single sense amplifier circuit.

7 Claims, 9 Drawing Sheets

METHOD OF PROGRAMMING/READING MULTI-LEVEL FLASH MEMORY USING SENSING CIRCUIT

This application is a divisional application of Serial No. 10/006,096, filed Dec. 10, 2001, now U.S. Pat. No 6,836,431.

BACKGROUND OF THE INVENTION

1. Field of the Invention

The invention relates generally to a method of programming/reading a multi-level flash memory using a sensing circuit. More particularly, the invention is concerned with a method of programming/reading a multi-level flash memory using a sensing circuit capable of simply processing a plurality of bit information of each of the cells that are sequentially processed and allowing a low current operation, by maximizing the number of a sense amplifier to increase the number of cells that could be processed at a time.

2. Description of the Prior Art

A general method of programming a flash memory includes an iterative program verification technique in which a desired threshold voltage is obtained by repeatedly performing program and verification.

A method of reading a conventional multi-level flash memory is process the sense amplifier having the number of comparators below one than the number of the threshold voltage level of the flash memory cell to process a plurality of bit data at a time or to process plural bit data by allowing a multiple sensing operation by a single comparator while changing the reference voltage.

Figure 1:
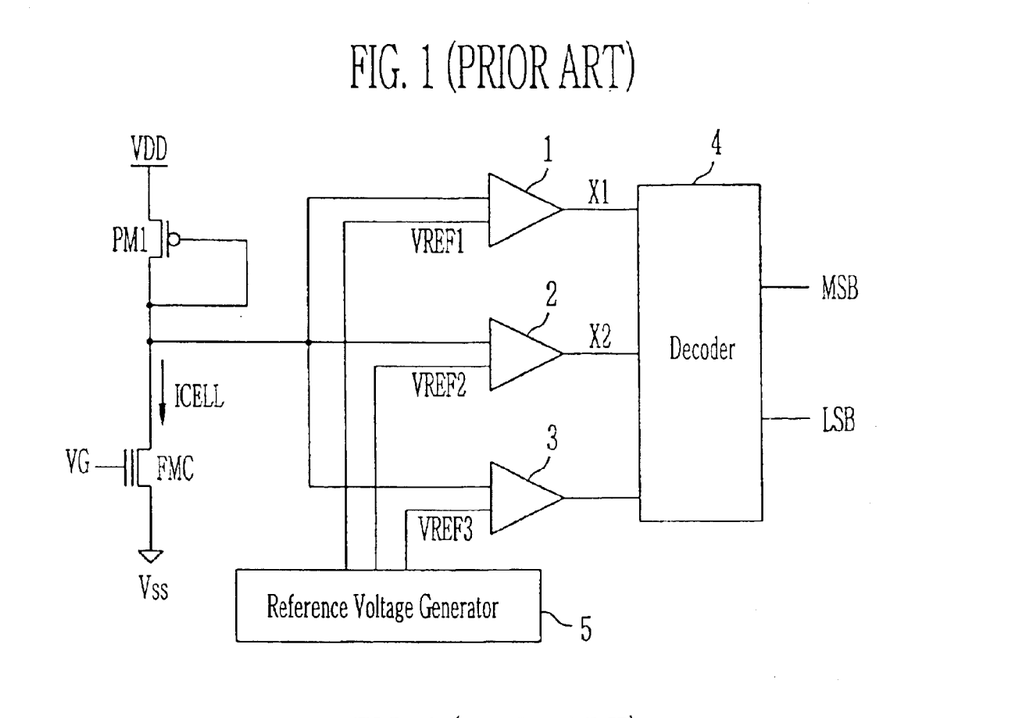
FIG. 1 is a circuit diagram shown to explain a method of programming/reading a multi-level flash memory using a conventional sensing circuit according to a first embodiment.

FIG. 1 is a circuit diagram shown to explain a method of programming/reading a multi-level flash memory using a conventional sensing circuit according to a first embodiment, which shows a circuit for sensing 4 (four) levels.

As shown in FIG. 1, the sensing circuit for programming/reading the multi-level flash memory includes a PMOS transistor PM1 a source of which is applied a power supply voltage VDD and drain and gate of which are commonly connected, wherein the commonly connected drain and gate is connected to a drain of a selected cell; a reference voltage generator 5 for generating first~third reference voltages VREF1~VREF3 first~third comparators 1~3 a first input terminal of which is connected to the drain of the selected cell FMC and second input terminals of which are applied first~third reference voltages VREF1~VREF3 respectively, for outputting the compared results X1~X3 and a decoder 4 for decoding outputs X1~X3 of the first~third comparators 1~3 to output 2 bit data MSB, LSB.

An operation of the sensing circuit for programming/reading the conventional multi-level flash memory constructed as above will be described as follows.

If a drain current is generated by applying a given voltage VG to the control gate of the multi-level flash memory cell FMC having four threshold voltage distributions, first~third comparators 1~3 change the drain current value correspondingly generated to the threshold voltage of the cell FMC into voltages in order to compare them with three reference voltages VREF1~VREF3 simultaneously. Then, the comparison results X1~X3 are decoded by the decoder 4 to represent information on at which step of the four levels the threshold voltage of the cell FMC is located using 2 (two) bit data MSB, LSB.

Figure 2:
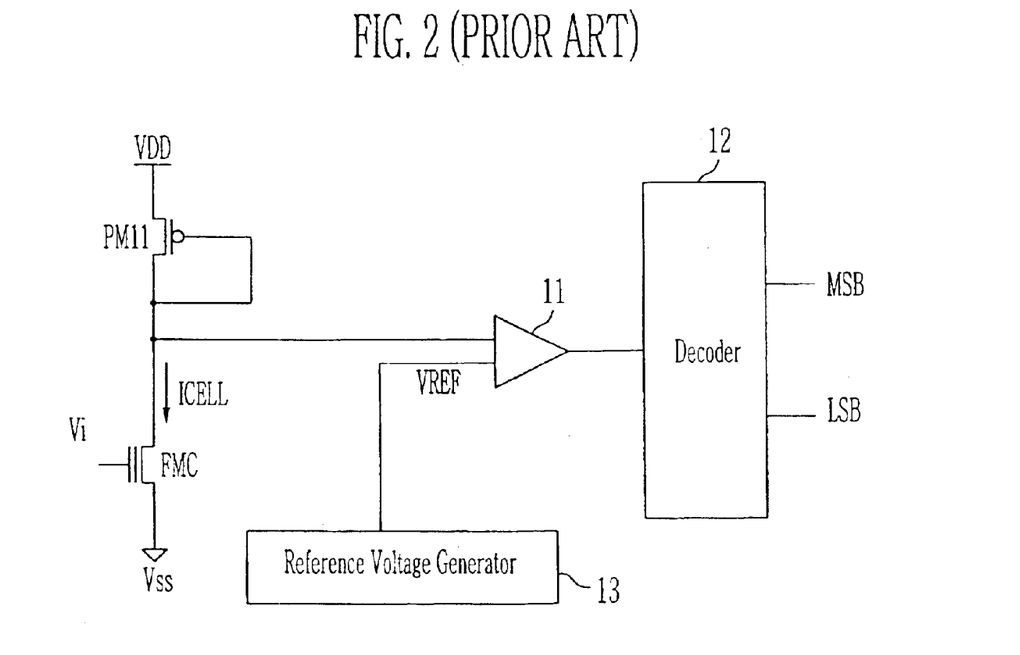
FIG. 2 is another circuit diagram shown to explain a method of programming/reading a multi-level flash memory using a conventional sensing circuit according to a second embodiment.

FIG. 2 is another circuit diagram shown to explain a method of programming/reading a multi-level flash memory using a conventional sensing circuit according to a second embodiment, which shows a circuit for sensing four levels.

As shown in FIG. 2, the sensing circuit for programming/reading the multi-level flash memory includes a PMOS transistor PM11 a source of which is applied a power supply voltage VDD and drain and gate of which are commonly connected, wherein the commonly connected drain and gate is connected to a drain of a selected cell; a reference voltage generator 13 for generating a reference voltage VREF a comparator 11 one terminal of which is connected to the drain of the selected cell FMC and the other terminal of which is connector to the reference voltage VREF and a decoder 12 for decoding the output of the comparator 11 to produce 2 bit data MSB, LSB.

An operation of the sensing circuit for programming/reading the conventional multi-level flash memory constructed as above will be described as follows.

Three types of voltages corresponding to a middle voltage value of each of four threshold voltages are sequentially applied to a control gate of the flash memory cell over three steps with them being increased or decreased. The comparator 11 senses whether a drain current flows in the cell FMC in every step to sense the control gate voltage in the step where the drain current starts to flow or the step where the current does not flow. Then, the decoder 12 receives the output of the comparator 11 to represent information on at which step of the four threshold voltage levels the threshold voltage of the cell FMC is located using 2 (two) bit data MSB, LSB.

As can be seen from the above, the conventional method of programming/reading the multi-level flash memory using the sensing circuit according to the first embodiment has disadvantages that it requires additional program circuit and its execution procedures are complicated. In addition, the method of reading the multi-level flash memory is simple in the operation of the circuit. However, there is a disadvantage that its sensing circuit becomes greater. Further, the conventional method of programming/reading the multi-level flash memory using the sensing circuit according to the second embodiment is simple and can be easily applied to a unit cell. However, there is a disadvantage that the method is difficult to be implemented within an actual memory array. In addition, there is an advantage that it requires circuits for program and read, respectively.

SUMMARY OF THE INVENTION

It is therefore an object of the present invention to provide a method of programming/reading a multi-level flash memory using a sensing circuit capable of simplifying the construction of a circuit and reducing the power consumption by allowing the multi-level reading step-by-step on an actual array and allowing a program/reading operation to be implemented in a single sense amplifier circuit.

In order to accomplish the above object, the present invention performs an automatic verification by which verification can be performed while the program is performed during a program operation of the multi-level flash memory cell and also senses the state of the threshold voltage using a sense amplifier used in the program operation while raising or lowering the voltage applied to a control gate step-by-step to store the level value generated in a counter according to its state in a register, during a reading operation of the multi-level flash memory cell.

In order to accomplish the above object, a method of programming/reading a multi-level flash memory using a sensing circuit according to the present invention is characterized in that it comprises a data storing step of storing data, at a register, corresponding to a level to be programmed; a second level program step of after a first program voltage is applied to word lines, turning off the sensing circuit to maintain the threshold voltage at a first level voltage if the data stored at the register is a first memory cell being a first data, and performing a program to raise the threshold voltage to a second level if the data stored at the register is the remaining memory cells being not the first data; a third level program step of after a second program voltage is applied to the word lines, turning off the sensing circuit to maintain the threshold voltage if the data stored at the register is the first or second memory cell being the first or second data, and performing a program to raise the threshold voltage to a third level if the data stored at the register is the remaining memory cells being not the first or second data; and a fourth level program step of after a third program voltage is applied to the word lines, turning off the sensing circuit to maintain the threshold voltage if the data stored at the register is the first, second or third memory cell being the first, second or third data, and performing a program to raise the threshold voltage to a fourth level if the data stored at the register is the remaining memory cells being not the first, second or third data.

Also, a method of reading a multi-level flash memory using a sensing circuit according to the present invention is characterized in that it comprises a first initialization step of setting to store a fourth data at all the registers, apply a first read voltage to word lines and output a first data to the counter; a first read step of sequentially comparing a first reference current of the reference current supply unit with a drain current of the memory cells in the comparator, and then storing the first data at a corresponding register to define a first memory cell, if the threshold voltage is lower than the reference cell, and maintaining the fourth data stored at the register to complete the read operation of the first memory cell, if the threshold voltage is lower than the reference cell; a second initialization step of setting to apply a second read voltage the word lines and to allow the counter to output a second data; a second read step of sequentially comparing a second reference current of the reference current supply unit with a drain current of the memory cells in the comparator only when the first memory cell is not, and then storing the second data at a corresponding register to define a second memory cell, if the threshold voltage is lower than the reference cell, and maintaining the fourth data stored at the register to complete the read operation of the second memory cell, if the threshold voltage is lower than the reference cell; a third initialization step of setting to apply a third read voltage the word lines and to allow the counter to output a third data; and a third read step of sequentially comparing a third reference current of the reference current supply unit with a drain current of the memory cells in the comparator only when the first or second memory cell is not, and then storing the third data at a corresponding register to define a third memory cell, if the threshold voltage is lower than the reference cell, and maintaining the fourth data stored at the register to complete the read operation of the third and fourth memory cells, if the threshold voltage is lower than the reference cell.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 3A:
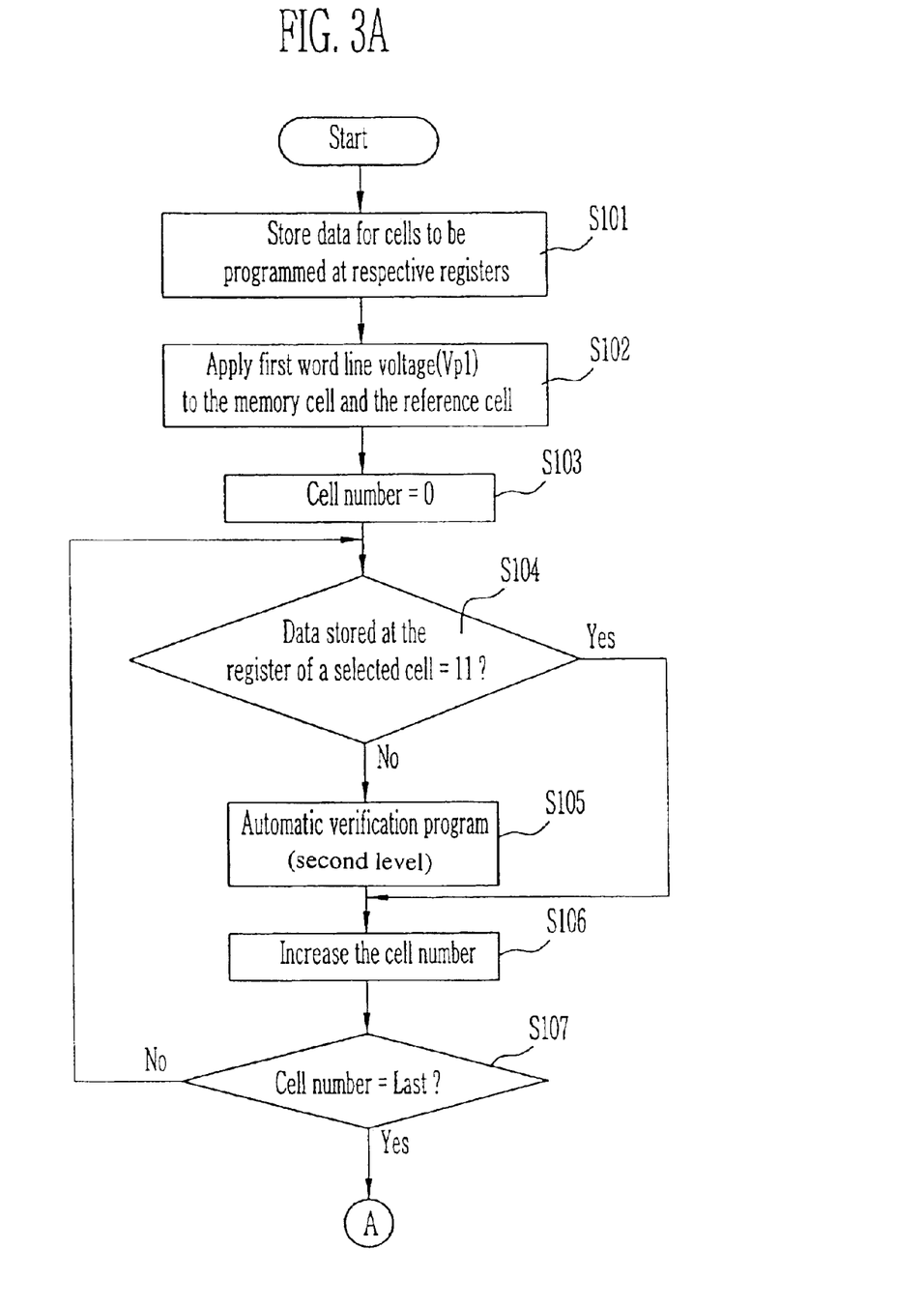
FIGS. 3A–3C are flowcharts shown to explain a method of programming a multi-level flash memory using a sensing circuit according to the present invention.
Figure 3B:
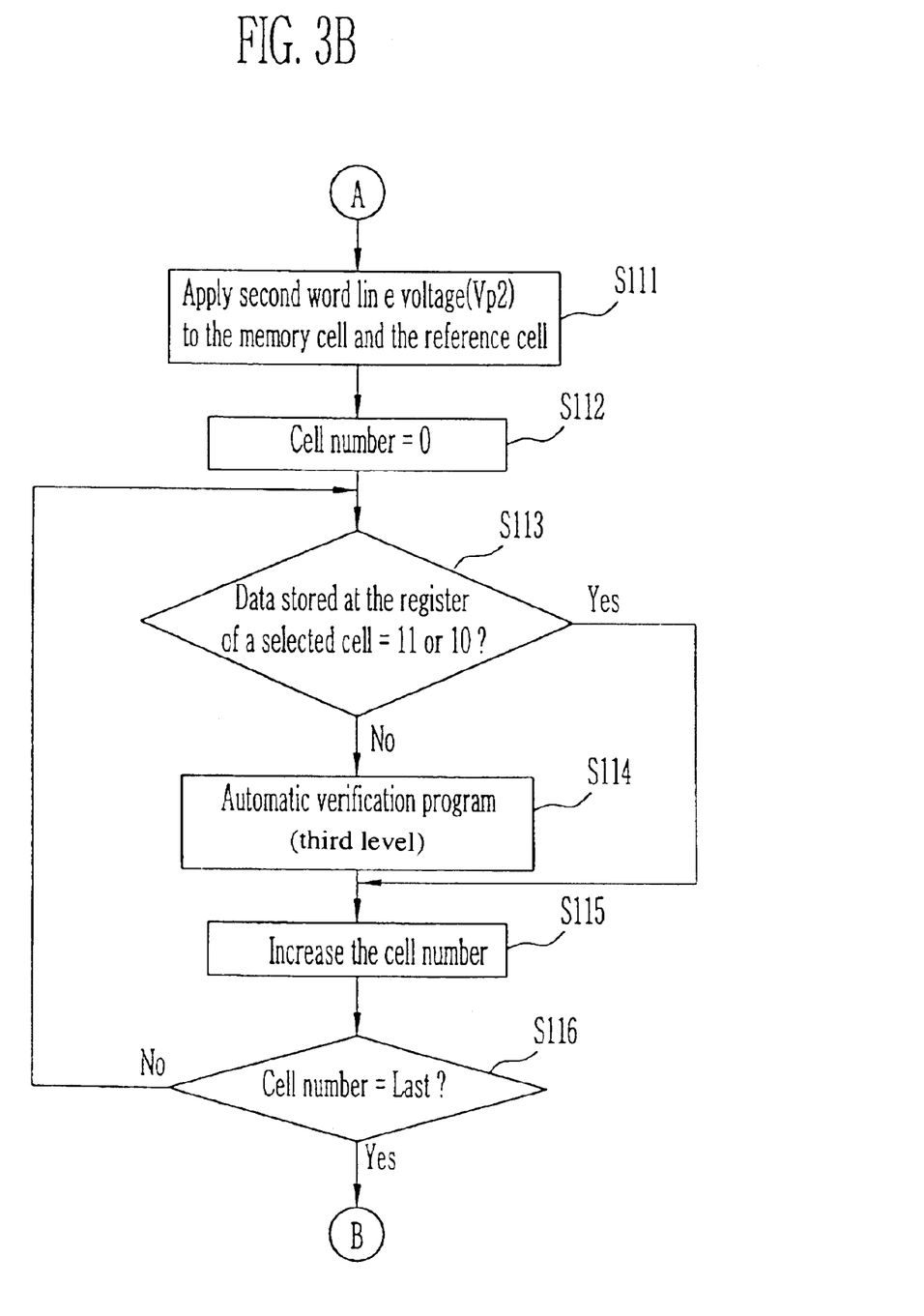
Figure 3C:
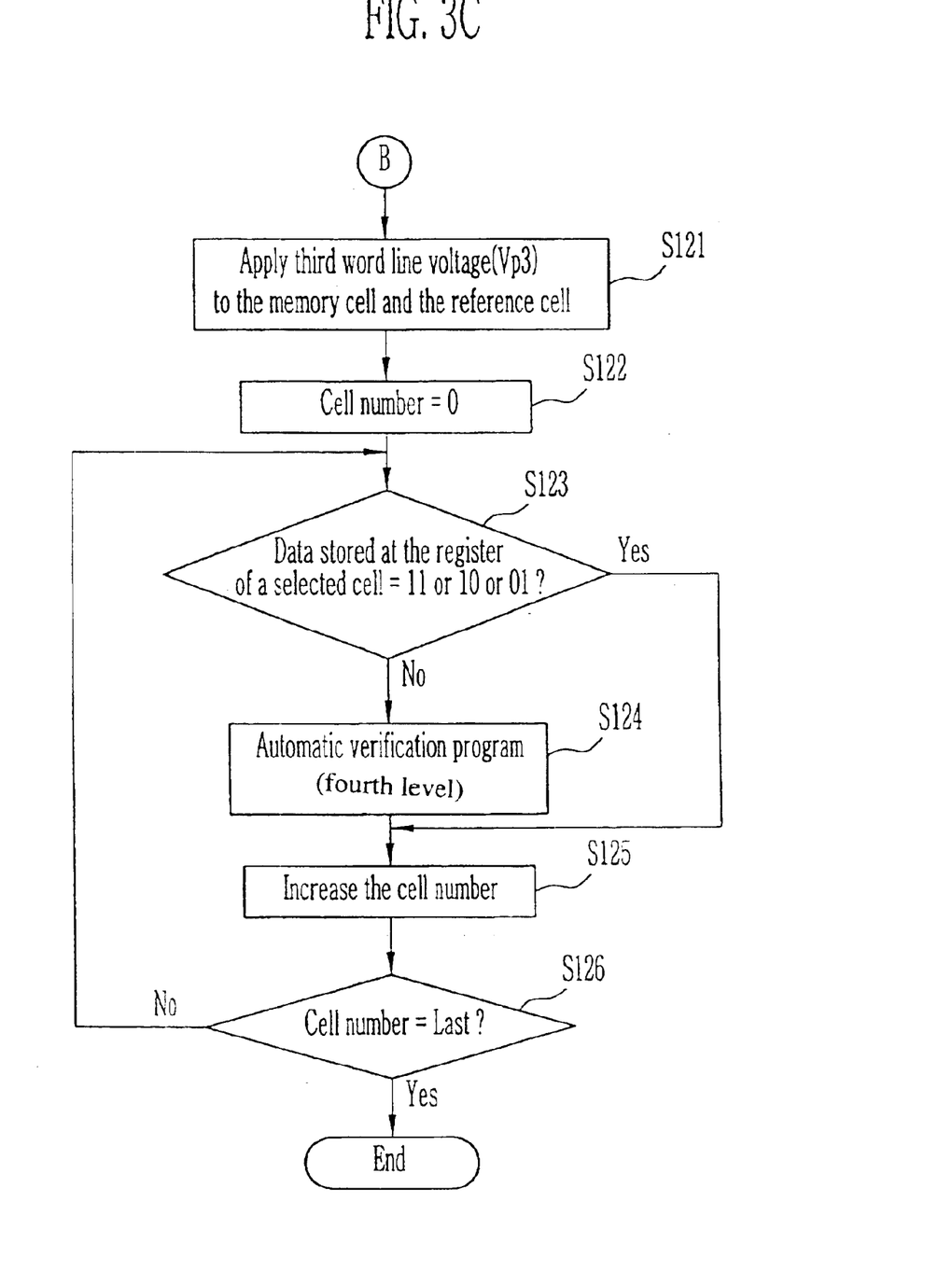

FIGS. 3A–3C are flowcharts shown to explain a method of programming a multi-level flash memory using a sensing circuit according to the present invention;

FIG. 3A is a flowchart illustrating a program method up to a second level by selecting a memory cell depending on information stored at a register.

As shown in FIG. 3A, data on what level a cell is to be programmed is stored at a register in order to program a flash memory (Step S101). Each of cells includes a register just as much as the number of bits that could represent the number of the level depending on the program degree. For example, if there are four steps first~fourth levels depending on the programmed degree of the flash memory, that is, the threshold voltage, each of the cells requires two registers since the four steps are represented into 2 (two) bits "11", "10", "01", "11" In the present invention, the case that the programmed degree of the flash memory is divided into four steps will be described as an example.

However, it should be noted that the present invention is not limited thereto but may be applied to the case that the programmed degree of the flash memory is more than four steps.

If data for programming a cell is stored at the register, a first word line voltage (Vp1) is applied to a memory cell and a reference cell (Step S102). The first word line voltage (Vp1) is a medium voltage that is higher than the threshold voltage of a cell corresponding to a second level but is lower than the threshold voltage of a cell corresponding to a third level.

If the first word line voltage (Vp1) is applied, a first cell is specified (Step S103).

If the first cell is specified, whether the cell is programmed or not is determined depending on the data stored at the register of a corresponding cell (Step S104). For example, if data stored at the register is "11", it means that the threshold voltage of a first level is maintained without programming the cell. If data stored at the register is "00", it means that a program must be completely performed up to a fourth level.

If the data stored at the register is not "11", it is determined that the program is performed at least up to a second level. In order to raise the threshold voltage of the cell to the second level, the program is performed by an automatic verification program method (Step S105). If the drain current of the cell being programmed is compared with the reference current of the reference current supply circuit in the sense amplifier while programming the memory cell to complete the program, the program operation is finished. Therefore, the memory cell simultaneously performs the program and verification.

If the data stored at the register is "11", it means that the program will not be performed since the program will not be performed. In other words, if the data stored at the register is "11", the program is not performed and the threshold voltage of the cell has a first voltage that is the lowest voltage in the first~fourth levels, so that upon a reading operation, data corresponding to "11" can be represented by allowing the largest drain current to flow. On the contrary, if the data stored at the register is "00", the program is performed in every step and the threshold voltage of the cell has the fourth voltage that is the highest voltage in the first~fourth levels, so that upon a reading operation, data corresponding to "00" can be represented by allowing the smallest drain current to flow.

If all of given operations are completed depending on the data stored at the register, the cell number is increased (Step S106).

If the cell number is increased to select a next cell, the above steps S104~S106 are again performed depending on the data stored at the register of the selected cell. If the cell for which the program is performed by the above operations is the last cell, the second level program step is finished and a third level program step is started (Step S107).

If the memory cell is programmed by the above program method, the program operation of the memory cell in which "11" is stored at the register and the memory in which "10" is stored at the register are all completed. Thus, the memory cell in which "11" is stored has the threshold voltage of the first level and the memory cell in which "10" is stored has the threshold voltage of the second level. Therefore, as the program operation of the memory cell in which "11" is stored at the register and the memory cell in which "10" is stored at the register is finished, a program operation for a memory cell in which "11" or "10" is stored at a registered will not be performed in the third level program step being a next step.

FIG. 3B is a flowchart illustrating a program method up to a third level by selecting a memory cell depending on information stored at a register. A program method up to the third level performs a program only for remaining cells except that data stored at the register is "11" or "10". The program method up to the third level is same to the program method up to the second level, except that a second word line voltage (Vp2) is applied to a memory cell and a reference cell in order to perform the program.

As shown in FIG. 3B, the second word line voltage (Vp2) is applied to the memory cell and the reference cell in order to perform the program (Step S111). The second word line voltage (Vp2) is a medium voltage that is higher than the threshold voltage of the cell corresponding to a third level but is lower than the threshold voltage of the cell corresponding to a fourth level.

If the second word line voltage (Vp2) is applied, the first cell is specified (Step S112).

If the first cell is specified, it is determined that the cell is programmed or not depending on data stored at a register of a corresponding cell. For example, if the data stored at the register is "11" or "10", the program is not performed but is selectively performed only for the remaining cells, since it means that the cell is programmed by a given threshold voltage in the second level program step (Step S113).

If the data stored at the register is not "11" or "10", it is determined that the program will be performed at least up to a third level. Thus, in order to raise the threshold voltage of the cell to the third level, the program is performed using an automatic verification program method (Step S114). If the drain current of the cell being programmed is compared with the reference current of the reference current supply circuit in the sense amplifier while programming the memory cell to complete the program, the program operation is finished. Therefore, the memory cell simultaneously performs the program and verification.

If all of given operations are completed depending on the data stored at the register, the cell number is increased (Step S115).

If the cell number is increased to select a next cell, the above steps S113~S115 are again performed depending on the data stored at the selected cell. If the cell for which the program is performed by the above operations is the last cell, the third level program step is finished and a fourth level program step is started (Step S116). By performing the third level program step mentioned above, the threshold voltages of all the cells, in which the data stored at the register is "01" or "00", become a third level voltage. Also, as the program operation of the memory cell in which "11", "10" or "01" is stored at the register is not finished, a program operation of a memory cell for which the program is completed is not performed, in the fourth level program step being a next step.

FIG. 3C is a flowchart illustrating a program method up to a fourth level by selecting a memory cell depending on information stored at a register. A program method up to the fourth level performs a program only for the cells in which data stored at the register is "00". The program method up to the fourth level is same to the program method up to the third level, except that a third word line voltage (Vp3) is applied to a memory cell and a reference cell in order to perform the program.

As shown in FIG. 3C, the third word line voltage (Vp3) is applied to the memory cell and the reference cell in order to perform the program (Step S121). The third word line voltage (Vp3) is a voltage higher than the threshold voltage of a cell corresponding to a fourth level.

If the third word line voltage (Vp3) is applied, the first cell is specified (Step S122).

If the first cell is specified, it is determined that the cell is programmed or not depending on data stored at a register of a corresponding cell. For example, if the data stored at the register is "11", "10" or "01", the program is not performed but is selectively performed only for the remaining cells since it means that the cell is programmed by a given threshold voltage in the third level program step (Step S123).

If the data stored at the register is "00", it is determined that the program will be performed up to the fourth level. Thus, in order to raise the threshold voltage of the cell to the fourth level, the program is performed using an automatic verification program method (Step S124). If the drain current of the cell being programmed is compared with the reference current of the reference current supply circuit in the sense amplifier while programming the memory cell to complete the program, the program operation is finished. Therefore, the memory cell simultaneously performs the program and verification.

If all of given operations are completed depending on the data stored at the register, the cell number is increased (Step S125).

If the cell number is increased to select a next cell, the above steps S123~S125 are again performed depending on the data stored at the register of the selected cell. If the cell for which the program is performed by the above operations is the last cell, the fourth level program step is finished and a fifth level program step is started (Step S126).

The fourth level program step mentioned above is performed to allow all the memory cells to have respective threshold voltages depending on the data stored at the register.

In the program step in each of the steps, if the drain current of the cell for which the program is performed becomes lower than the reference current, the program operation is stopped since the sense amplifier driving circuit stops the operation of the sense amplifier.

Figure 4A:
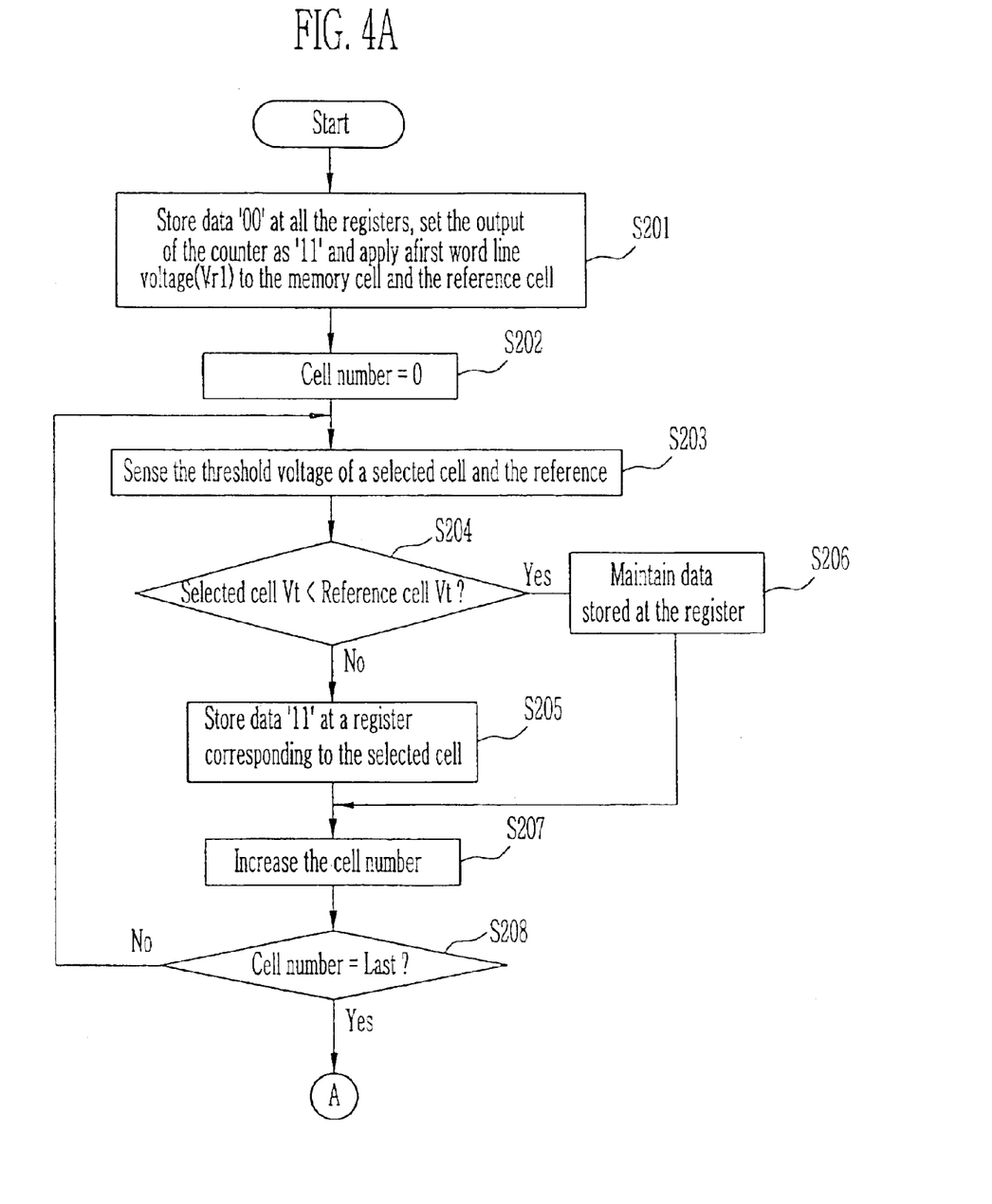
FIGS. 4A–4C are flowcharts shown to explain a method of reading a multi-level flash memory using a sensing circuit according to the present invention.
Figure 4B:
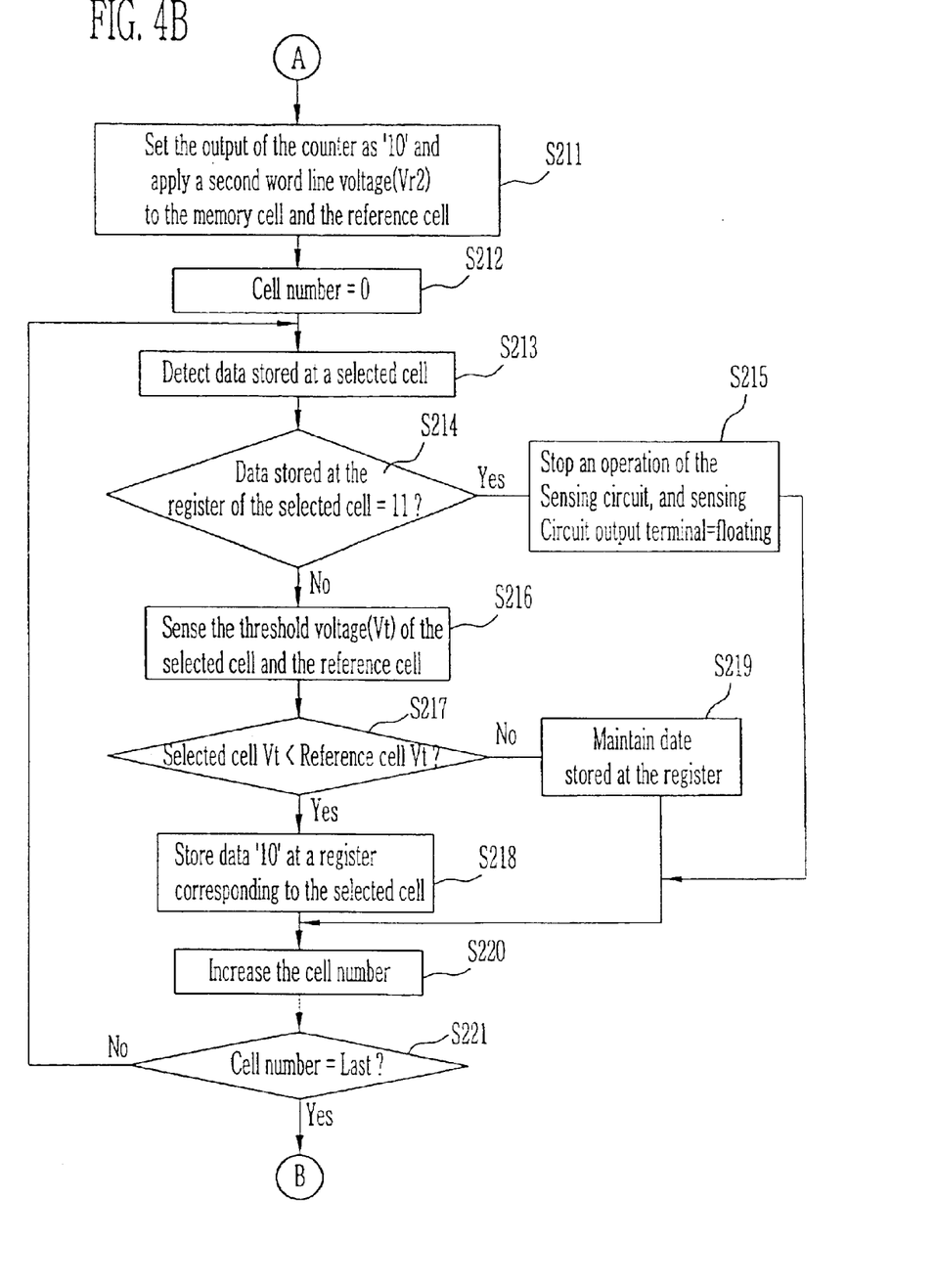
Figure 4C:
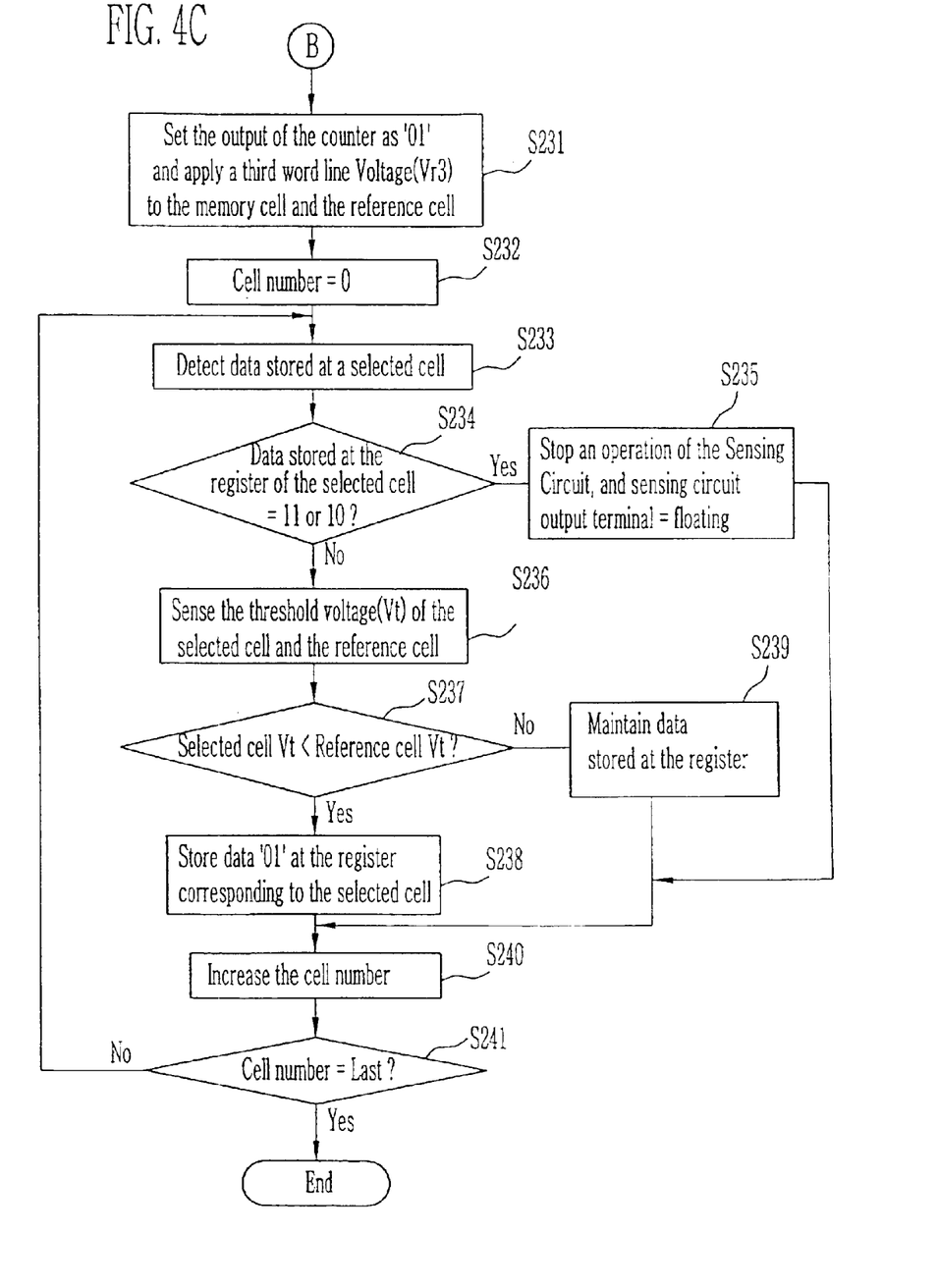

FIGS. 4A–4C are flowcharts shown to explain a method of reading a multi-level flash memory using a sensing circuit according to the present invention;

A first read step classifies a memory cell the threshold voltage of which is a first level to store a first data "11" corresponding to the first level at a corresponding register. A second read step does not perform a read operation for cells in which the first data is stored at the register but classifies a memory cell the threshold voltage of which is a second level to store a second data "10" corresponding to the second level at a corresponding register. A third read step does not perform a read operation for cells in which the first or second data is stored at the register but classifies a memory cell the threshold voltage of which is a third level to store a third data "01" corresponding to the third level at a corresponding register. The threshold voltage of the cell in which any data is not stored at the register until the third read step is performed is determined to be a fourth level, so that the fourth data "00" is stored at the register.

FIG. 4A is a flowchart shown to explain a first read step of classifying a memory cell the threshold voltage of which is a first level depending on the threshold voltage level of the programmed cell and of then storing a first data "11" corresponding to a first level at a corresponding register.

As shown in FIG. 4A, if the first read step is started, a fourth data "00" is stored at all the registers. An output of a counter is set to the first data "11". Then, a first word line voltage (Vr1) is applied to the memory cell and the reference cell (Step S201).

If the first word line voltage (Vr1) is applied, a first memory cell is specified (Step S202).

If the first memory cell is specified, the sense amplifier used in the program step senses a drain current of the memory cell and a drain current of the reference cell (Step S203).

As a result of sensing the drain current of the memory cell and the drain current of the reference cell and comparing their threshold voltage (Step S204) if the threshold voltage of the memory cell is lower than the threshold voltage of the reference cell, the first data "11" generated in the counter is stored at a corresponding register (Step S205). It means that if the threshold voltage of the memory cell is lower than the threshold voltage of the reference cell, the threshold voltage of the memory cell corresponds to a first level voltage. Due to this, a lot of drain current flows, which means that data stored at the memory cell corresponds to the first data "11". Therefore, a sense amplifier driving circuit drives a switching element connected to an output terminal of the counter and the first data "11" generated in the counter is also stored at the register, depending on a signal of the sense amplifier.

On the other hand, if the threshold voltage of the memory cell is higher than the threshold voltage of the reference cell, the fourth data "00" stored at the register is maintained (Step S206). It means that if the threshold voltage of the memory cell is higher than the threshold voltage of the reference cell, the threshold voltage of the memory cell is higher than a first level voltage. As it is difficult to exactly know what level voltage is the threshold voltage of memory cell, the fourth data "00" stored at the register is maintained unt0l the level of an exact threshold voltage is known.

Depending on the threshold voltage of the memory cell, it is determined that the first data "11" is stored at the register or the stored fourth data "00" is maintained. Thus, if the read operation is completed, the cell number is increased in order to read a next memory cell (Step S207).

If the cell number is increased to select a next cell, the above steps S203~S207 are again performed to store or maintain data at the register depending on the threshold voltage of the memory cells. If the cell that performed the read operation by the above operation is the last cell, the first read step is finished (Step S208).

If the first read step mentioned above is completed, the read operation of the memory cell the threshold voltage of which is a first level voltage is completed to store the first data "11" at the register. From a second read step, the read operation is not performed. In addition, the fourth data "00" is maintained in the register in the memory cell the threshold voltage of which is more than the first level voltage. Also, the read operation is performed even in the second read step in order to sense an exact threshold voltage and to store data at a register.

FIG. 4B is a flow chart shown to explain a second read step of classifying the memory cell the threshold voltage of which is a second level depending on the threshold voltage level of the programmed cell to store the first data "10" corresponding to a second level at a corresponding register.

As shown in FIG. 4B, if the second read step is started, the fourth data "00" stored at the register is maintained and an output of the counter is set to a second data "10". Also, a second word line voltage (Vr2) is applied to the memory cell and the reference cell (Step S211).

If the second word line voltage (Vr2) is applied, a first memory cell is specified (Step S212).

If the first memory cell is specified, data of the register storing information on the threshold voltage of the memory cell is detected (Step S213) and it is determined that the data stored at the register is the first data "11" or not (Step S214). If the data stored at the register is the first data "11" an operation of the sensing circuit is stopped by the sense amplifier driving circuit and an output state of the sensing circuit is then floated (Step S215). This is because the read operation for the cell the data of which stored at the register is the first data "11" is not required, since the read operation is completed in the first read step so that information on the threshold voltage is the cell stored at the register.

On the other hand, if the data stored at the register is the fourth data "00" as an exact state is so far not stored at the register, a drain current of the memory cell and a drain current of a reference cell are sensed using the sense amplifier used in the program step in order to perform a read operation (Step S216).

As a result of sensing the drain current of the memory cell and the drain current of the reference cell and comparing their threshold voltage (Step S217) if the threshold voltage of the memory cell is lower than the threshold voltage of the reference cell, the second data "10" generated in the counter is stored at a corresponding register (Step S218). It means that if the threshold voltage of the memory cell is lower than the threshold voltage of the reference cell, the threshold voltage of the memory cell corresponds to a second level voltage. Due to this, a drain current corresponding to the second level voltage flows, which means that data stored at the memory cell corresponds to the second data "10". Therefore, a sense amplifier driving circuit drives a switching element connected to an output terminal of the counter and the second data "10" generated in the counter is also stored at the register, depending on a signal of the sense amplifier.

On the other hand, the threshold voltage of the memory cell is higher than the threshold voltage of the reference cell, the fourth data "00" stored at the register is maintained (Step S219). It means that if the threshold voltage of the memory cell is higher than the threshold voltage of the reference cell, the threshold voltage of the memory cell is higher than a second level voltage. As it is difficult to exactly know what level voltage is the threshold voltage of memory cell, the fourth data "00" stored at the register is maintained unt01 the level of an exact threshold voltage is known.

Depending on the threshold voltage of the memory cell, it is determined that the second data "10" is stored at the register or the stored fourth data "00" is maintained. Thus, if the read operation is completed, the cell number is increased in order to read a next memory cell (Step S220).

If the cell number is increased to select a next cell, the above steps S213~S220 are again performed to store or maintain data at the register depending on the threshold voltage of the memory cells. If the cell that performed the read operation by the above operation is the last cell, the second read step is finished (Step S221).

If the second read step mentioned above is completed, the read operation of the memory cell the threshold voltage of which is a second level voltage is completed to store the second data "11" at the register. From a third read step, the read operation is not performed. In addition, the fourth data "00" is maintained in the register in the memory cell the threshold voltage of which is more than the second level voltage. Also, the read operation is performed even in the third read step in order to sense an exact threshold voltage and to store data at a register.

FIG. 4C is a flow chart shown to explain a third read step of classifying the memory cell the threshold voltage of which is a third level depending on the threshold voltage level of the programmed cell to store a third data "01" corresponding to the third level at a corresponding register.

As shown in FIG. 4C, if the third read step is started, a fourth data "00" stored at the register is maintained and an output of the counter is set to a third data "10". Also, a third word line voltage (Vr3) is applied to the memory cell and the reference cell (Step S231).

If the third word line voltage (Vr3) is applied, a first memory cell is specified (Step S232).

If the first memory cell is specified, data of the register storing information on the threshold voltage of the memory cell is detected (Step S233) and it is determined that the data stored at the register is a first data "11" or a second data "10" (Step S234). If the data stored at the register is the first data "11" or the second data "10", an operation of the sensing circuit is stopped by the sense amplifier driving circuit and an output state of the sensing circuit is then floated (Step S235). This is because the read operation for the cell the data of which stored at the register is the first data "11" or the second data "10" is not required, since the read operation is completed in the first read step so that information on the threshold voltage is the cell stored at the register. The memory cell for which the read operation is finished has the first or second data "11" or "10" at its register. Also, a memory cell for which the read operation must be performed has the fourth data "00" stored at its register. Therefore, if the read operation is performed only for the memory cell an upper bit of which is 0 (zero) by detecting only the upper bit among data stored at the register, the construction of the circuit can be further simplified.

On the other hand, if the data stored at the register is the fourth data "00" as an exact state is so far not stored at the register, a drain current of the memory cell and a drain current of a reference cell are sensed using the sense amplifier used in the program step in order to perform a read operation (Step S236).

As a result of sensing the drain current of the memory cell and the drain current of the reference cell and comparing their threshold voltage (Step S237) if the threshold voltage of the memory cell is lower than the threshold voltage of the reference cell, the third data "01" generated in the counter is stored at a corresponding register (Step S238). It means that if the threshold voltage of the memory cell is lower than the threshold voltage of the reference cell, the threshold voltage of the memory cell corresponds to a third level voltage. Due to this, a drain current corresponding to the third level voltage flows, which means that data stored at the memory cell corresponds to the third data "01". Therefore, a sense amplifier driving circuit drives a switching element connected to an output terminal of the counter and the third data "01" generated in the counter is also stored at the register, depending on a signal of the sense amplifier.

On the other hand, if the threshold voltage of the memory cell is higher than the threshold voltage of the reference cell, the fourth data "00" stored at the register is maintained (Step S239). What the threshold voltage of the memory cell is higher than the threshold voltage of the reference cell means that the threshold voltage of the memory cell is a fourth level voltage that is the highest. Therefore, the fourth data "00" stored at the register is maintained intact register and data for the threshold voltage of the memory cell is simultaneously defined. Thereby, as the cell the threshold voltage of which is the third level voltage and the cell the threshold voltage of which is the fourth level voltage are determined at the same time, data are stored at all the registers so that the read operation for the memory cell of all the level is performed.

Depending on the threshold voltage of the memory cell, it is determined that the third data "01" is stored at the register or the stored fourth data "00" is maintained. Thus, if the read operation is completed, the cell number is increased in order to read a next memory cell (Step S240).

If the cell number is increased to select a next cell, the above steps S233~S240 are again performed to store or maintain data at the register depending on the threshold voltage of the memory cells. If the cell that performed the read operation by the above operation is the last cell, the third read step is finished (Step S241).

Thus, all the memory cells complete the read operation according to the threshold voltage level. Also, the all the memory cells are connected to the sensing circuit and sequentially select cells using an address signal to detect data depending on the threshold voltage. Therefore, the read operation for the memory cell of all the levels can be performed with a single sensing circuit.

In the above, 2 (two) bits of first~fourth levels has been explained as an example. However, if the number of registers is increased depending on the bit number and the voltage applied to the word lines is further applied step-by-step, the above method of programming/reading the multi-level flash memory can be applied to a simple circuit structure using a single sensing circuit in more bit than 2 (two) bits.

A method of programming/reading a multi-level flash memory using a sensing circuit according to the present invention will be below described, taking one circuit as an example.

Figure 5:
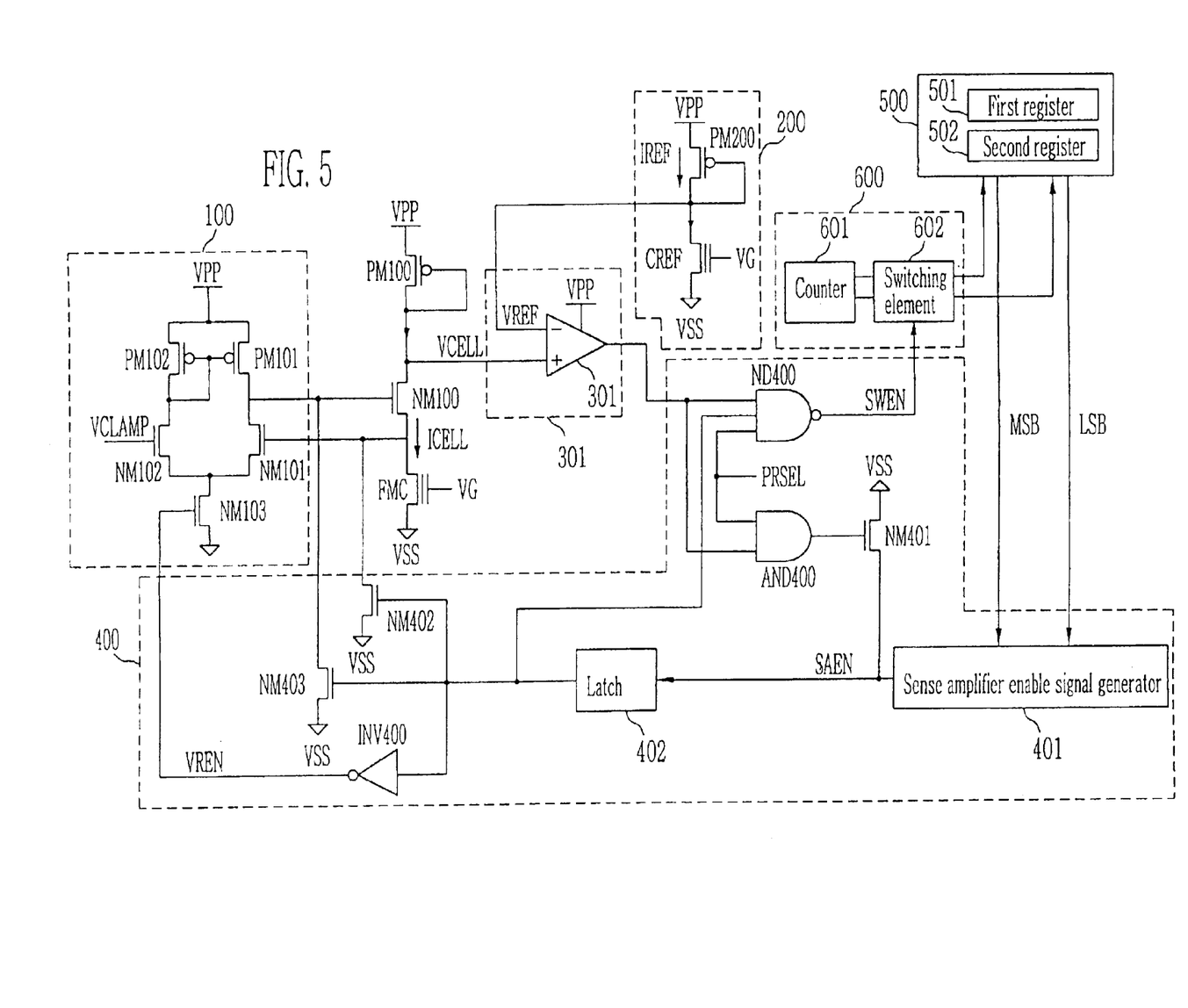
FIG. 5 is a circuit diagram shown to explain a method of programming/reading a multi-level flash memory using a sensing circuit according to the present invention.
Figure 6:
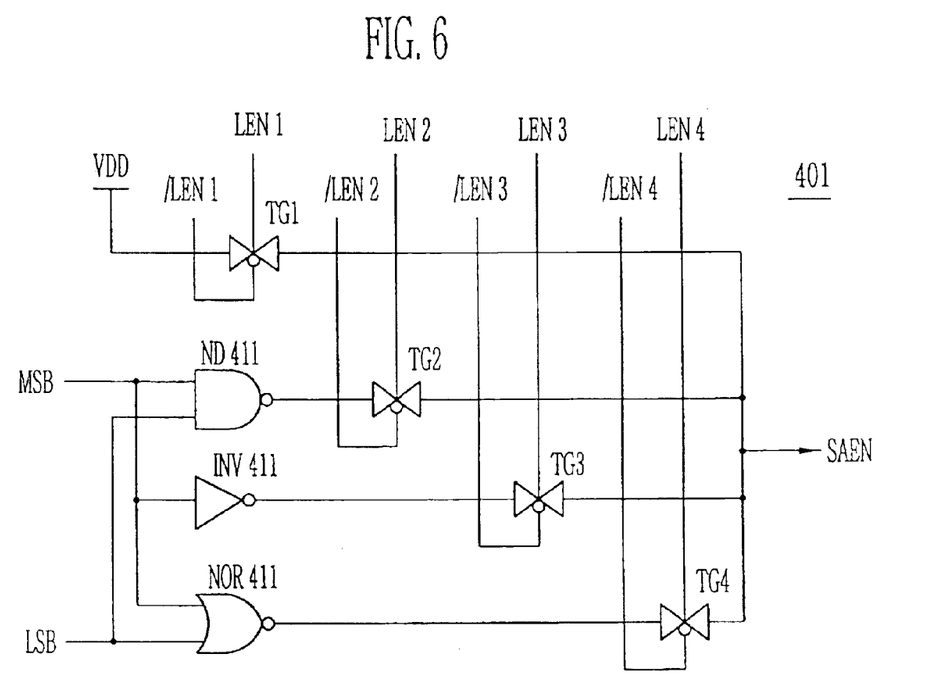
FIG. 6 is a circuit diagram shown to explain a sense amplifier in an enable signal generator in FIG. 5.

FIG. 5 is a circuit diagram shown to explain a method of programming/reading a multi-level flash memory using a sensing circuit according to the present invention, and FIG. 6 is a circuit diagram shown to explain a sense amplifier in an enable signal generator in FIG. 5.

As shown in FIG. 5, a circuit for programming/reading a multi-level flash memory using a sensing circuit includes a voltage controller 100 for controlling the voltage applied to a drain of a selected cell FMC; a PMOS transistor PM100 to a source of which a program voltage VPP is applied, wherein gate and drain of which are commonly connected; a NMOS transistor NM100 a drain of which is connected to the PMOS transistor PM100 a gate of which is connected to an output terminal of the voltage controller 100 and a source of which is connected to the drain of the selected cell FMC; a reference voltage generator 200 for generating a reference voltage VREF; a comparator 300 to one terminal of which the voltage from the commonly connected drain of the PMOS transistor PM100 and the NMOS transistor NM100 is applied and to the other terminal of which the reference voltage VREF of the reference voltage generator 200 is applied; a sense amplifier driving setting unit 400 for receiving 2 (two) bit information MSB and LSB to determine whether to perform a program operation, upon a program mode, and for stopping the operation of the comparator 300 and the voltage controller 100 when the program operation is completed; a register array 500 consisting of the same number of registers 501 and 502 to the bit number of information in a cell array that must be processed by a single sense amplifier in order to provide the sense amplifier driving setting unit 400 with 2 (two) bit information in every step upon a read mode; and a counter unit 600 for generating an output of 2 (two) bit determining data stored at the register array 500 in every step of the read mode.

The voltage controller 100 includes a first PMOS transistor PM101 a source of which is applied a program voltage VPP and a gate of which is commonly connected to the drain; a second PMOS transistor PM102 a source of which is applied the program voltage VPP is applied, a gate of which is commonly connected to the drain and the gate of which is commonly connected to the first PMOS transistor; a first NMOS transistor NM101 a gate of which is connected to a drain of a selected cell FMC and a drain of which is connected to the drain of the first PMOS transistor PM101; a second NMOS transistor NM102 a gate of which is applied a clamping voltage VCLAMP and a drain of which is connected to the drain of the second PMOS transistor PM102; and a third NMOS transistor NM103 a gate of which is applied a voltage control enable signal VREN and a source of which is commonly connected to the connected between the first NMOS transistor NM101 and the second NMOS transistor NM102 wherein the third NMOS transistor NM103 is connected between the source and a ground voltage VSS terminal.

The reference voltage generator 200 includes a PMOS transistor PM200 a source of which is applied the program voltage VPP and a commonly connected drain and gate of which is connected to an input terminal of the comparator 300, and a reference cell CREF a gate of which is applied a control gate voltage VG and connected between the PMOS transistor PM200 and the ground voltage VSS terminal.

The comparator 300 is driven by the program voltage VPP. The comparator 300 has a differential amplifier 301 for comparing the reference voltage VREF of the reference voltage generator 200 applied to the one terminal of the comparator 300 and a cell voltage VCELL applied to the other terminal of the comparator 300.

The sense amplifier driving setting unit 400 includes a sense amplifier enable signal generator 401 for receiving 2 (two) bit data MSB and LSB from the register array 500 to produce a sense amplifier enable signal SAEN upon a program; a latch 402 for latching the sense amplifier enable signal SAEN of the sense amplifier enable signal generator 401; a NAND gate ND400 for NANDing the output of the comparator 300, the output of the latch 402 and the input of the program/read mode select signal PRSEL to output a switching enable signal SWEN; an AND gate AND400 for ANDing the output of the comparator 300 and the program/read mode select signal PRSEL; a first NMOS transistor NM401 a drain of which is applied the sense amplifier enable signal SAEN a gate of which is applied the output of the AND gate AND400 and a source of which is connected to the ground voltage VSS; a second NMOS transistor NM402 a gate of which is applied to the output of the latch 402, a drain of which is connected to the gate of the second NMOS transistor NM102 of the voltage controller 100 and a source of which is connected to the ground voltage VSS; a third NMOS transistor NM403 a gate of which is applied the output of the latch 402 and connected between the NMOS transistor NM100 and the ground voltage VSS; and an inverter INV400 for inverting the output of the latch 402 to output a voltage enable signal VREN The sense amplifier enable signal generator 401 includes, as shown in FIG. 6, a first transfer gate TG1 controlled by a first level enable signal LEN1 and its inverted signal/LEN1 to selectively output the power supply voltage VDD; a NAND gate ND411 for NANDing the most significant bit MSB and the least significant bit LSB of the register array 500; a second transfer gate TG2 controlled by a second level enable signal LEN2 and its inverted signal/LEN2 to selectively output the output of the NAND gate ND411; an inverter INV411 for inverting the most significant bit MSB; a third transfer gate TG3 controlled by a third level enable signal LEN3 and its inverted signal/LEN3 to selectively output the output of the inverter INV411; a NOR gate NOR411 for NORing the most significant bit MSB and the least significant bit LSB; and a fourth transfer gate TG4 controlled by a fourth level enable signal LEN4 and its inverted signal/LEN4 to selectively output the output of the NOR gate NOR411.

The counter unit 600 includes a counter 601 for performing an actual counting, and a switching element 602 controlled by the switching enable signal SWEN of the sense amplifier driving setting unit 400 to selectively output the output of the counter 601.

An operation of the sensing circuit for programming/reading the multi-level flash memory constructed above will be described as follows.

According to the above construction, the sensing circuit for programming/reading the multi-level flash memory requires a three step program operation and a three step reading operation in case of programming/reading a flash memory array having four levels.

First, upon a program, the voltage VG of the control gate is increased in every step and the reference current IREF is maintained to be same, so that the a program is performed while the threshold voltage of the cell is raised step-by-step. The program is performed by repeatedly reading data stored in each step at the registers 501 and 502 of the register array 500 to determine whether the data will perform the program in a corresponding level.

If the data is "11", an initial threshold voltage value is maintained. If the data is "10", the program is performed in the first step. If the data is "01", the program is performed in the first and second steps. If the data is "00", the program is performed in the first, second and third steps. The threshold voltage of each of the cells is raised while the program is performed in each of the steps. As soon as the cell current ICELL is lowered than the reference current IREF the program is stopped by the output VREN of the second and third NMOS transistors NM402 and NM403 and the inverter INV400 in the sense amplifier driving setting unit 400.

Meanwhile, upon a read operation, in the first step, the first level is sensed to discriminate the first level from the second, third and fourth levels. In the second step, the second level is sensed to discriminate the second level form the third and fourth levels. In the third step, the third level is sensed to discriminate the third level form the fourth level in a not-sensed cell.

These read operations will be described in detail in every step.

In the first step, all the registers 501 and 502 are first set to 0 (zero) and the output of the counter unit 600 is set to "11". Thereafter, the control gate voltage VG of the memory cell FMC is set to a first voltage (Vr1) If the threshold voltage of the memory cell FMC is lower than that of the reference cell CREF the output of the counter unit 600 is stored at the register array 500. If the threshold voltage of a selected memory cell FMC is higher than the threshold voltage of the reference cell CREF the register array 500 maintains intact its data stored as 0 (zero). At this time, the first voltage (Vr1) is set to a value that is higher than the threshold voltage of the first level cell and is lower than the threshold voltage of the second, third and fourth level cell and the reference cell.

In the second step, after the output of the counter unit 600 is increased to "10" and the control gate voltage VG of the cell is increased to the second voltage (Vr2), columns of cells connected to the sense amplifier are sequentially sensed. In each of the column, an existing data of the register corresponding to its cell is read. If the existing data is "11", the sense amplifier 301 is not driven but the output of the sense amplifier is floated to close the switching element 602 of the counter unit 600 so that the output of the counter unit 600 is not stored at the register array 500. If the existing data is not "11", a sensing is performed. At this time, if the threshold voltage of a selected cell FMC is lower than the threshold voltage of the reference cell CREF the output of the sense amplifier 301 becomes logically HIGH by means of the second level cell, so that "10" being the output of the counter unit 600 is stored at the register array 500. On the other hand, if the threshold voltage of the selected cell FMC is higher than the threshold voltage of the reference cell CREF the output of the sense amplifier 301 becomes logically LOW by means of the third or fourth level cell to close the switching element 602 of the counter unit 600 so that the output of the counter unit 600 is not stored at the register array 500.

If all the sense amplifiers in the memory array perform simultaneously the above procedure by the number of column, the second step is finished. The first and second levels of each of the registers 501 and 502 in the register array 500 are sensed/written and the remaining levels are reset to 0 (zero).

In the third step, after the output of the counter unit 600 is increased to "01" and the control gate voltage VG of the cell is increased to the third voltage (Vr3), columns of cells connected to the sense amplifier are sequentially sensed. In each of the column, an existing data of the register corresponding to its cell is read. If the existing data is "11" or "10", the sense amplifier 301 is not driven but the output of the sense amplifier is floated to close the switching element 602 so that the output of the counter unit 600 does not enter the register array 500. If the existing data is not "11" or "10", a sensing is performed. At this time, if the threshold voltage of a selected cell FMC is lower than the threshold voltage of the reference cell CREF the output of the sense amplifier 301 becomes logically HIGH by means of the third level cell, so that "01" being the output of the level state specification circuit is stored at the register array 500. On the other hand, if the threshold voltage of the selected cell FMC is higher than the threshold voltage of the reference cell CREF the output of the sense amplifier 301 becomes logically LOW by means of the fourth level cell to close the switching element 602 so that the output of the level state specification circuit does not enter the register array 500.

If all the sense amplifiers in the memory array perform simultaneously the above procedure by the number of column, the third step is finished. In the state of the register, the first, second and third level cells are sensed/written, and the remaining cells are maintained to be reset as the fourth level cells.

In the above, description has been made on the case that the sensing circuit for programming/reading the above multi-level flash memory is a 4-level 2-bit cell. However, in case of having more than 4-level, if the bit number of the counter unit 600 is same to the bit number of the cell and the number of the step is also below by one than the level number of the cell, a flash memory cell array having information of more than 2-bit in one cell can be applied.

As can be understood from the above description, a method of programming/reading a multi-level flash memory using a sensing circuit according to the present invention can reduce the power consumption by comparing a current step and a previous data stored at a register upon a sensing in every step to stop an operation of a not-sensed sense amplifier. Further, the present invention can process data with a simple circuit by sending an output of a level state specification circuit to the register depending on the sensing result of the sensing circuit without a complicated calculation of the data processing or maintaining a previous level data. In addition, the present invention can improve the processing capability by locating a lot of sense amplifiers within a memory chip to extend the number of cells that are simultaneously processed.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of reading a multi-level flash memory using a sensing circuit that includes a comparator, a voltage regulating block, a reference current supply unit, a sense amplifier driving determining circuit, a register array, and a counter, the method comprising:

a first initialization step of setting to store a fourth data in a plurality of registers, apply a first read voltage to word lines, and output a first data to the counter;

a first read step of sequentially comparing a first reference current of the reference current supply unit with a drain current of a plurality of memory cells in the comparator, and then storing a first data at a corresponding register to define a first memory cell when a threshold voltage is lower than the reference cell, and maintaining the fourth data stored in the register to complete a read operation of the first memory cell when the threshold voltage is lower than the reference cell;

a second initialization step of setting to apply a second read voltage to the word lines, and to allow the counter to output a second data;

a second read step of sequentially comparing a second reference current of the reference current supply unit with a drain current of the plurality of memory cells in the comparator only when the first memory cell is not read, and then storing the second data at a corresponding register to define a second memory cell when the threshold voltage is lower than the reference cell, and maintaining the fourth data stored in the register to complete the read operation of the second memory cell when the threshold voltage in lower than the reference cell;

a third initialization step of setting to apply a third read voltage to the word lines, and to allow the counter to output a third data; and a third read step of sequentially comparing a third reference current of the reference current supply unit with a drain current of the plurality of memory cells in the comparator only when one of the first and second memory cells is not read, and then storing the third data at a corresponding register to define a third memory cell when the threshold voltage is lower than the reference cell, and maintaining the fourth data stored in the register to complete the read operation of the third and fourth memory cells when the threshold voltage is lower than the reference cell.

2. The method according to claim 1, wherein the register includes a number of bits that represent all numbers of levels by which the memory cells can be programmed to allow more than 2 bits to be stored when data in the multi-bit flash memory cell is more than 2 bits.

3. The method according to claim 1, wherein the sense amplifier driving determining circuit determines whether the sensing circuit has to be driven depending on the data stored in the register.

4. The method according to claim 1, wherein the first to third read voltages applied to the word lines are sequentially applied from a low voltage, and each correspond to a medium voltage of the threshold voltage levels.

5. The method according to claim 1, wherein the first data is "11," the second data is "10," the third data is "01," and the fourth data is "00."

6. The method according to claim 1, wherein the third read step detects only data of upper bits among data stored in the register, and then determines them to be one of the first and second memory cell when the data of upper bits in "1" to be remaining cells when the data of upper bits is "0."

7. The method according to claim 1, wherein the sensing circuit is turned OFF and ON by the sense amplifier driving determining circuit depending on the first to fourth data stored in the register.

* * * * *